United States Patent
Koveshnikov et al.

(10) Patent No.: US 7,687,225 B2
(45) Date of Patent: Mar. 30, 2010

(54) OPTICAL COATINGS

(75) Inventors: Sergei V. Koveshnikov, Hillsboro, OR (US); Juan E. Dominguez, Hillsboro, OR (US); Kyle Y. Flanigan, Portland, OR (US); Ernisse Putna, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1577 days.

(21) Appl. No.: 10/955,601

(22) Filed: Sep. 29, 2004

(65) Prior Publication Data

US 2006/0073424 A1   Apr. 6, 2006

(51) Int. Cl.
   *G03F 1/00* (2006.01)
   *B44C 1/22* (2006.01)
(52) U.S. Cl. .......... 430/290; 430/322; 216/56; 427/387; 427/245; 427/249.15; 427/255.15; 427/255.28; 438/950; 438/964
(58) Field of Classification Search ........ 430/290, 430/322; 438/960, 964; 216/56; 427/245, 427/255.28, 249.15, 255.15, 387, 583
See application file for complete search history.

(56) References Cited

U.S. PATENT DOCUMENTS

| | | | |
|---|---|---|---|
| 4,491,628 A | 1/1985 | Ito et al. | |
| 4,693,781 A | 9/1987 | Leung et al. | |
| 5,395,790 A | 3/1995 | Lur | |
| 5,492,858 A | 2/1996 | Bose et al. | |
| 5,541,436 A | 7/1996 | Kwong et al. | |
| 5,789,024 A * | 8/1998 | Levy et al. ............ | 427/244 |
| 5,956,598 A | 9/1999 | Huang et al. | |
| 6,054,393 A | 4/2000 | Niccoli | |
| 6,057,208 A | 5/2000 | Lin et al. | |
| 6,103,456 A | 8/2000 | Tobben et al. | |
| 6,129,091 A | 10/2000 | Lee et al. | |
| 6,159,823 A | 12/2000 | Song et al. | |
| 6,165,854 A | 12/2000 | Wu | |
| 6,228,740 B1 * | 5/2001 | Niroomand et al. ...... | 438/398 |
| 6,261,751 B1 * | 7/2001 | Forbes et al. ............ | 430/510 |
| 6,265,283 B1 | 7/2001 | Nariman et al. | |
| 6,329,118 B1 | 12/2001 | Hussein et al. | |
| 6,365,529 B1 | 4/2002 | Hussein et al. | |
| 6,417,070 B1 | 7/2002 | Ballantine et al. | |
| 6,444,588 B1 | 9/2002 | Holscher et al. | |
| 6,541,382 B1 | 4/2003 | Cheng et al. | |
| 6,824,879 B2 | 11/2004 | Baldwin et al. | |
| 6,828,253 B2 * | 12/2004 | Gole et al. ............... | 438/753 |
| 6,876,017 B2 | 4/2005 | Goodner | |
| 6,930,028 B1 | 8/2005 | Hanratty et al. | |
| 7,101,798 B2 | 9/2006 | Goodner et al. | |
| 7,119,031 B2 * | 10/2006 | Blalock et al. ........... | 438/758 |
| 7,125,783 B2 | 10/2006 | Lo et al. | |

(Continued)

OTHER PUBLICATIONS

D. A. Loy and K. J. Shea, "Bridged Polysilsesquioxanes. Highly Porous Hybrid Organic-Inorganic Materials," Chem. Rev. 95 (1995) p. 1431-1442.

(Continued)

*Primary Examiner*—Thorl Chea
(74) *Attorney, Agent, or Firm*—Fish & Richardson P.C.

(57) ABSTRACT

Systems and techniques involving optical coatings for semiconductor devices. An implementation includes a substantially isotropic, heterogeneous anti-reflective coating having a substantially equal thickness normal to any portion of a substrate independent of the orientation of the portion.

19 Claims, 5 Drawing Sheets

U.S. PATENT DOCUMENTS

| | | | |
|---|---|---|---|
| 7,157,755 | B2 | 1/2007 | Goodner |
| 2001/0026979 | A1 | 10/2001 | Chern |
| 2002/0094593 | A1 | 7/2002 | Chiou et al. |
| 2004/0165187 | A1* | 8/2004 | Koo et al. .................. 356/445 |
| 2005/0029229 | A1 | 2/2005 | Chae et al. |
| 2005/0158897 | A1* | 7/2005 | Sze et al. ..................... 438/29 |
| 2005/0266045 | A1* | 12/2005 | Canham et al. ............. 424/423 |
| 2006/0029879 | A1 | 2/2006 | Flanigan et al. |

OTHER PUBLICATIONS

Aroutiounian et al., "Calculations of the reflectance of porous silicon and other antireflection coating to silicon solar cells," *Thin Solid Films* 403-404: 517-521 (2002).

Beloto et al., Sponge-Like and Columnar Porous Silicon Implanted with Nitrogen by Plasma Immersion Ion Implantation (PIII), *Int. Conf. on Plasma Based Ion Implantation*, Grenoble, France, Jun. 25-28, 2001, 17 pages.

Birkholz et al., "Solar-cell suitable µc-Si Films Grown by ECR-CVD," *Mat. Res. Soc. Symp. Proc.* 609: A5.5.1-A5.5.6 (2000).

Lee, J.-S., N.-H., Cho, "Nanostructural and photoluminescence features of nanoporous silicon prepared by anodic etching," *Applied Surface Science* 190: 171-175 (2002).

Wang et al., "Nanometer-scale pores in low-k dielectric films probed by positron annihilation lifetime spectroscopy," *Applied Physics Letters* 81(23): 4413-4415 (2002).

Whelan et al., "Sealing of Porous Low-*k* Dielectrics," *Electrochemica and Solid-State Letters* 7(2): F8-F10(2004).

Yamani et al., "Revival of interband crystalline reflectance from nanocrystallites in porous silicon by immersion plating," *Applied Physics Letters* 74(23): 3483-3485 (1999).

Yang et al., "Study of $SiH_4$-based PECVD Low-k Cardon-doped Silicon Oxide," Mat. Res. Soc. Symps. Proc. 612: D3.3.1-D3.3.7 (2000).

\* cited by examiner

OPTICAL COATINGS

BACKGROUND

This disclosure relates to optical coatings.

The fabrication of microelectronic devices can involve the patterning of regions on a semiconductor wafer using lithographic systems and techniques. Such patterning can involve the controlled exposure of photosensitive materials to electromagnetic radiation. When such exposure is imprecise—either due to flaws or the inherent properties of the exposure systems and techniques—then the resultant patterning may be flawed.

DESCRIPTION OF DRAWINGS

Like reference symbols in the various drawings indicate like elements.

DETAILED DESCRIPTION

Figure 1:
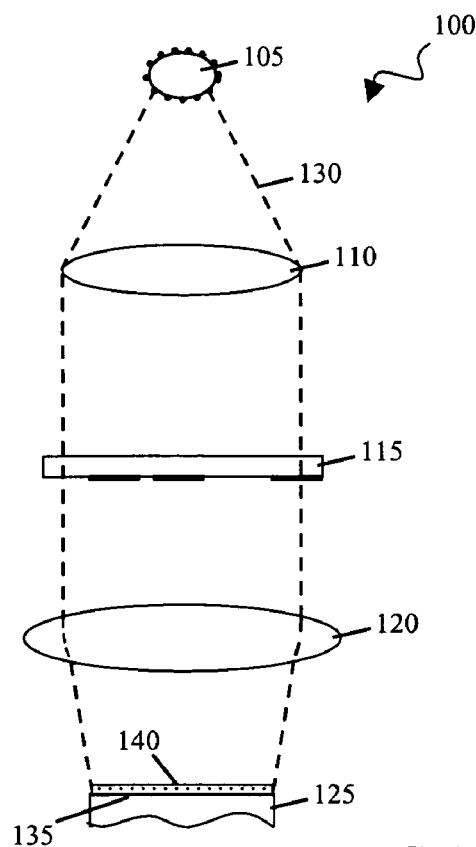
FIG. 1 shows a block diagram of a lithography system.

FIG. 1 shows a photolithography system 100. System 100 includes an illumination source 105, an illumination system 110, a reticle 115, an imaging system 120, and a substrate 125.

Illumination source 105 generates electromagnetic radiation 130. Radiation 130 can be fully or partially coherent in that the emitted optical waves maintain a fixed and predictable phase relationship with each other for a period of time. Radiation 130 can be adapted for use in lithographic patterning of microelectronic devices by exposing photosensitive materials.

Illumination system 110 can include an aperture, a condenser, as well as additional devices for collecting, collimating, directing, filtering, and focusing radiation 130 emitted from source 105.

Reticle 115 is positioned in system 100 by a mask stage to influence the incidence of radiation 130 upon substrate 125. Reticle 115 can include different regions that transmit electromagnetic radiation 130 with different transmissivities and/or phases. The transmission of electromagnetic radiation 130 by reticle 115 can be engineered to image desired features on substrate 125. For example, reticle 115 can be a binary mask or a phase shifting mask.

Imaging system 120 can include an aperture, an objective, as well as additional devices for collecting, filtering, and focusing the portion of radiation 130 that passes through reticle 115 onto substrate 125. For example, imaging system 120 can include a filtering projection lens and/or reduction optics.

Substrate 125 is a workpiece to be patterned by system 100. Substrate 125 includes a working surface 135 that is covered by an optical coating 140. Substrate 125 can be presented to system 100 by a vacuum chuck or other support such that radiation 130 is focused in the vicinity of working surface 135 to image desired features. Optical coating 140 covers all or a portion of working surface 135 to limit undesirable optical effects that occur during exposure to electromagnetic radiation 130, as discussed further below.

Figure 2:
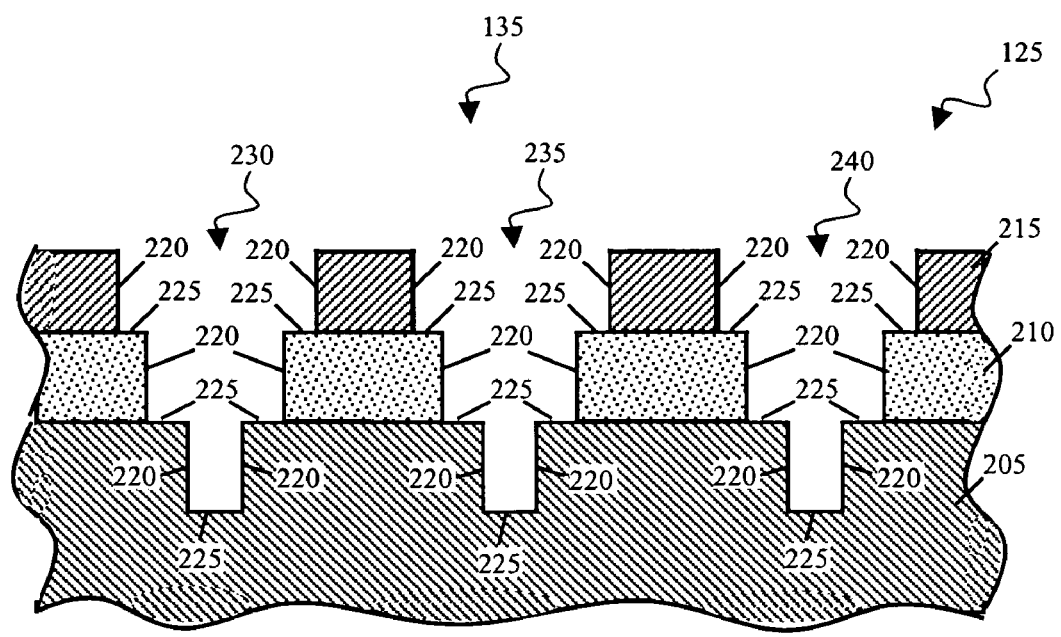
FIG. 2 is a sectional view of a portion of a substrate.

Optical coating 140 can be formed on working surface 135 of substrate 125 in a variety of ways. FIG. 2 shows a sectional view of a portion of working surface 135 of substrate 125 before formation of optical coating 140. At the illustrated processing stage, substrate 125 includes a first layer 205, a second layer 210, and a third layer 215. Layer 205 can be the base wafer or another layer formed during previous processing above the base wafer. Layers 210, 215 can include electrical insulators such as silicon oxide or nitride, semiconducting materials such as p- or n-doped silicon, or conducting materials such as copper or aluminum. For example, layers 210, 215 can be interlayer dielectrics, interconnect layers, device layers, resist layers, and/or sacrificial layers. Layers 210, 215 need not be homogeneous and can include various heterogeneities such as glue metals and pore sealants on porous interlayer dielectric layers.

Working surface 135 includes collections of sidewalls 220 and plateaus 225 that define a collection of features 230, 235, 240. Features 230, 235, 240 each extend from working surface 135 into the interior of substrate 125.

If working surface 135 was exposed using electromagnetic radiation 130 without optical coating 140 being present, reflection and other optical effects involving sidewalls 220, plateaus 225, and other features (including processing debris) may have undesirable effects. For example, standing waves may be established and reflective notching may occur. These effects can reduce image quality, may inadvertently expose areas that were to remain unexposed, and may increase the likelihood of defects and potentially impair device performance.

Figure 3:
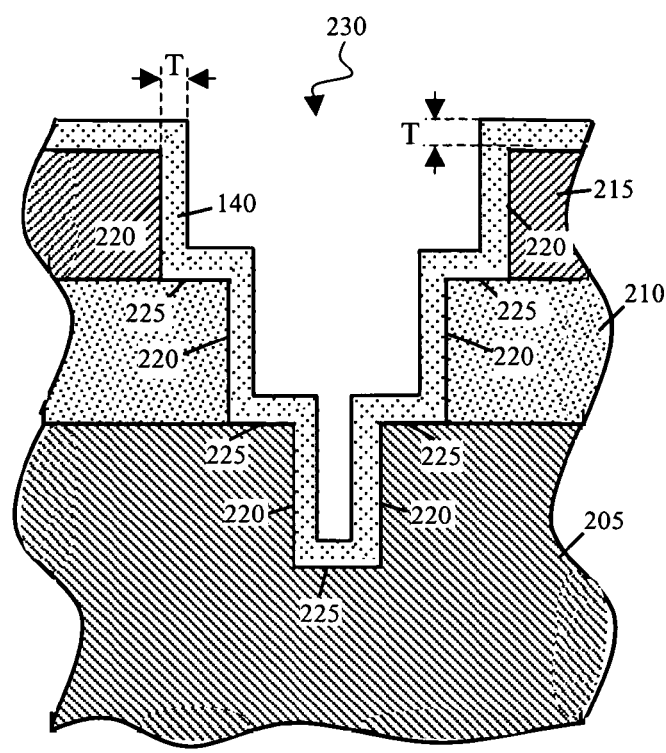
FIG. 3 is a sectional view of one feature of the substrate of FIG. 2 after formation of an optical coating.

FIG. 3 shows working surface 135 after formation of optical coating 140 to limit such undesirable optical effects. In one implementation, optical coating 140 can be isotropically deposited. In isotropic deposition, the rate of deposition normal to any portion of a substrate is substantially independent of the orientation of that portion. As a result, optical coating 140 can have a substantially equal thickness T on both sidewalls 220 and plateaus 225. Thickness T can be sufficiently thick to allow electromagnetic radiation used to expose a substrate (such as electromagnetic radiation 130) to interact with optical coating 140. For example, optical coating 140 may be between 50 and 400 nm thick. Isotropic deposition of optical coating 140 can be achieved using chemical vapor deposition (CVD) systems and techniques.

In one implementation, optical coating 140 can be a heterogeneous material with dissimilar constituent materials with dissimilar optical properties. For example, optical coating 140 can be a porous material that includes a solid backbone defining pores, vessels, or holes. The defined pores, vessels, or holes can be filled with ambient atmosphere or other gas.

The dimensions and arrangement of pores, vessels, or holes, along with the nature of the constituent backbone materials, can be selected to obtain desirable optical properties. For example, optical coating 140 can be effective to scatter electromagnetic radiation used in the formation of microelectronic devices (such as electromagnetic radiation 130). In an implementation, optical coating 140 can be a mesoporous material. Mesoporous materials generally have pores, vessels, or holes with dimensions of between 2 nm and 100 nm. The pores, vessels, or holes can be interconnected in mesoporous materials and can scatter the appropriate electromagnetic radiation (such as electromagnetic radiation 130).

A porous optical coating 140 can be formed using a polysilicon backbone formed using plasma enhanced (PE) CVD or thermal CVD. A polysilicon film can be chemical vapor deposited from a number of different precursors, such as silane ($SiH_4$) or other gases in the silane family such as 3-methylsilane $(CH_3)_3SiH$. In one implementation, $SiH_4$ can be used to deposit a polysilicon film using PE CVD at temperatures below 500° C. After deposition, mesopores can be formed by wet etching of the polysilicon film in hydrofluoric acid (HF). The etching can be anodic etching.

Figure 4:
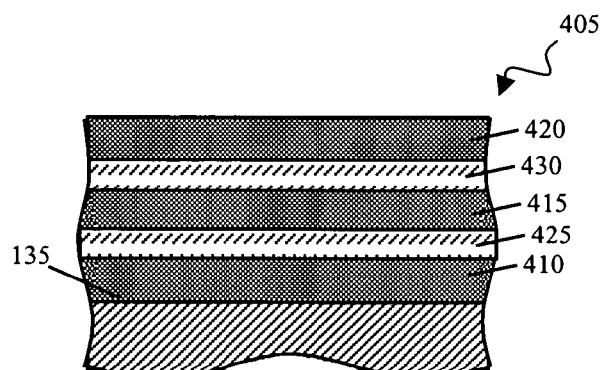
FIGS. 4 and 5 show an implementation of a technique for forming a porous optical coating.
Figure 5:
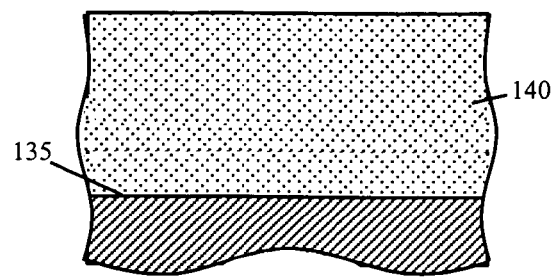

FIGS. 4 and 5 show another implementation of a technique for forming a porous optical coating. In particular, as shown in FIG. 4, a precursor coating 405 is first formed on working surface 135. Precursor coating 405 includes alternating backbone layers 410, 415, 420 and porogen layers 425, 430. Backbone layers 410, 415, 420 can be solid materials that are interconnected to span precursor coating 405. Porogen layers 425, 430 are a space-filling, sacrificial material that can establish pores, vessels, or holes within the material(s) forming backbone layers 410, 415, 420. For example, porogen layers 425, 430 can be removed or degraded to establish pores, vessels, or holes, e.g., by thermal annealing.

FIG. 5 shows working surface 135 after porogen layers 425, 430 have established pores, vessels, or holes within backbone layers 410, 415, 420. In particular, a porous optical coating 140 is formed.

In one implementation, porogen layers 425, 430 include 1,1,1,2-tetrafluoroethane and backbone layers 410, 415, 420 include polysilicon formed by chemical vapor deposition.

Figure 6:
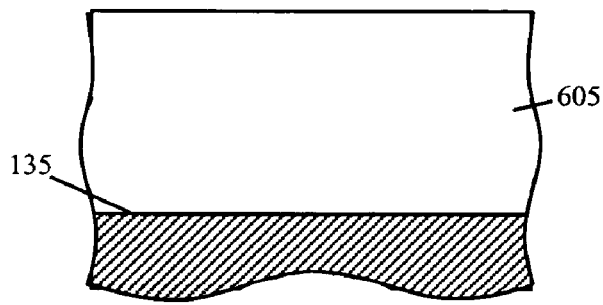
FIGS. 6 and 7 show another implementation of a technique for forming a porous optical coating.
Figure 7:
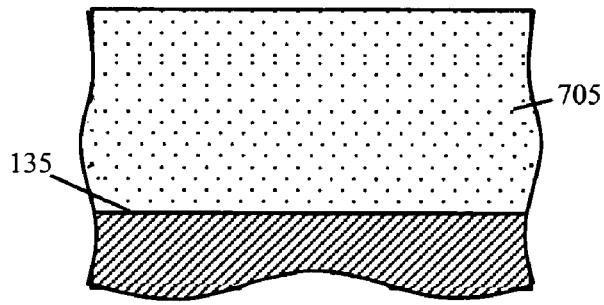

FIGS. 6 and 7 show another implementation of a technique for forming a porous optical coating. In particular, a precursor coating 605 is first formed on working surface 135. Precursor coating 605 can be homogeneous in the bulk and can include a relatively uniform concentration of low molecular weight ligands (e.g., methyl groups ($CH_3$—) and/or ethyl groups ($CH_3CH_2$—)) dispersed through the bulk. Such precursor coatings 605 can be produced, e.g., by CVD of polysilicon. This can use, at least as part of the source feed, a gas in the silane family that includes such low molecular weight ligands.

After the precursor coating 605 is formed, the low molecular weight ligands can be made to outgas, yielding a nanoporous coating 705. Nanoporous coating 705 includes nanopores. Nanopores are pores, vessels, or holes with dimensions generally below 10 nm. The outgassing can be driven by oxidative combustion of the ligands. For example, the outgassing can be driven by oxidation in nitrous oxide ($N_2O$). The oxidation can occur during deposition or after a precursor pulse.

In some implementations, nanoporous coating 705 can be further modified (e.g., by anodic etching) to achieve a mesoporous optical coating 140.

Porous optical coatings 140 can also be formed by tailoring the properties of porous interlayer dielectric materials (ILD's). For example, porogen concentrations can be selected or silicate ILD's can be dry etched to yield coatings that scatter the electromagnetic radiation used to expose a substrate (such as electromagnetic radiation 130).

In another implementation, optical coating 140 can include a chromophore or other molecule that changes the interaction between optical coating 140 and the electromagnetic radiation used to expose a substrate. For example, optical coating 140 can include dye molecules that absorb the electromagnetic radiation used to expose a substrate, such as aromatic or other molecules that include conjugated π-bonds. Optical coating 140 can also include dopant molecules that change the reflective properties of optical coating 140. For example, exposure of polysilicon to ammonia ($NH_3$) or carbon monoxide (CO) can change the reflectance of polysilicon.

Figure 8:
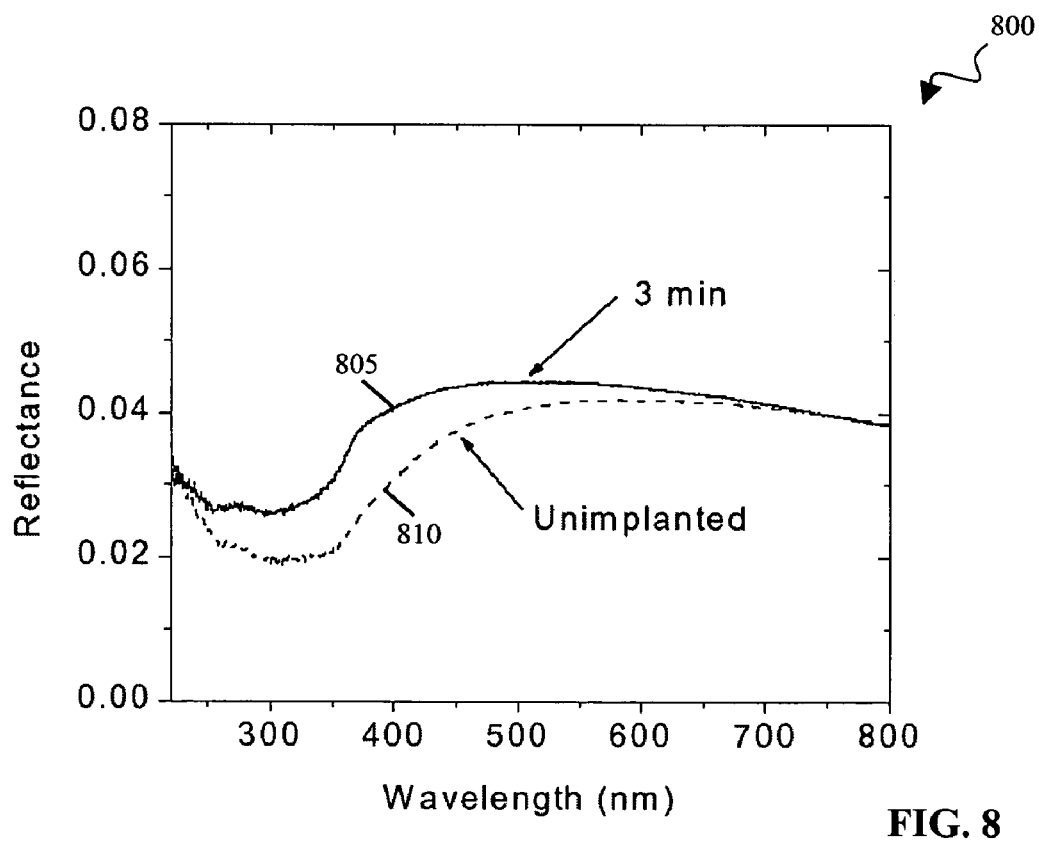
FIG. 8 is a graph that illustrates the impact of doping an optical coating.

Also, nitrogen ($N_2$) introduced by low energy ion bombardment can change the reflectance of polysilicon. FIG. 8 is a graph 800 that illustrates the impact of doping a related material, namely amorphous silicon, with nitrogen. Graph 800 includes a pair of traces 805, 810 that indicate the reflectance of amorphous silicon as a function of wavelength of the incident light. Trace 805 denote the reflectance of implanted amorphous silicon that has been bombarded for 3 minutes with $N_2$, whereas trace 810 denotes the reflectance of unimplanted amorphous silicon. As can be seen, the reflectance of implanted amorphous silicon is increased relative to the reflectance of unimplanted amorphous silicon. It is expected that the implantation of polysilicon with $N_2$ will yield comparable increases in relative reflectance.

Molecules that change the interaction between optical coating 140 and the electromagnetic radiation used to expose a substrate can be introduced in a variety of other ways. For example, volatile molecules can be vapor deposited within porous optical coatings 140. As another example, silicate ILD's can be doped with atomic nitrogen by exposure to $NH_3$, by exposure to a remote nitrogen plasma, or by low energy ion bombardment using $N_2$. In silica-based ILD's, such nitrogen doping can help increase reflectance of electromagnetic radiation with a wavelength in the vicinity of 248 nm.

In another implementation, optical coating 140 can be a heterogeneous material that includes a molecule that changes the interaction between optical coating 140 and electromagnetic radiation. For example, optical coating 140 can be a chemical-vapor-deposited, anodic HF-etched, mesoporous optical coating implanted with $N_2$ using low energy ion bombardment.

Figure 9:
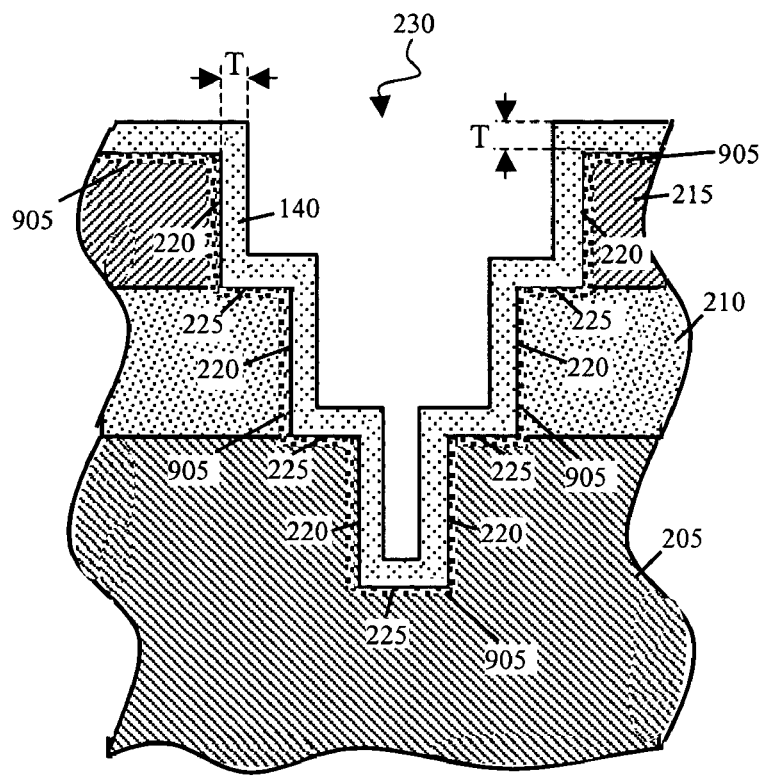
FIG. 9 is a sectional view of another substrate after formation of an optical coating.

FIG. 9 shows another implementation of working surface 135 after formation of optical coating 140 to limit undesirable optical effects. In this implementation, working surface 135 includes an underlayer 905 deposited on both sidewalls 220 and plateaus 225 under optical coating 140. Underlayer 905 can have material properties that are different from the material properties of optical coating 140 so that optical coating 140 can easily be removed from working surface 135. For example, underlayer 905 can be a thin silica ($SiO_2$) film when optical coating 140 is a mesoporous polysilicon layer. In other implementations, underlayer 905 can include an etch stop material.

Once optical coating 140 is formed at working surface 135, the impact of the undesirable effect associated with exposure of working surface 135 (discussed above) can be reduced. For example, optical coating 140 can be designed to act as an anti-reflective coating in that coherent reflection from working surface 135 is minimized. Such anti-reflective coatings can be applied at various stages during the processing of semiconductor wafers to form microelectronic devices.

Figure 10:
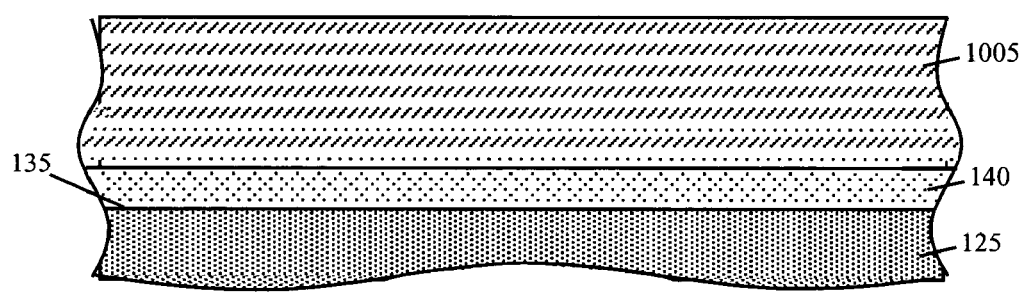
FIGS. 10-12 show the use of an optical coating as a bottom antireflective coating.
Figure 11:
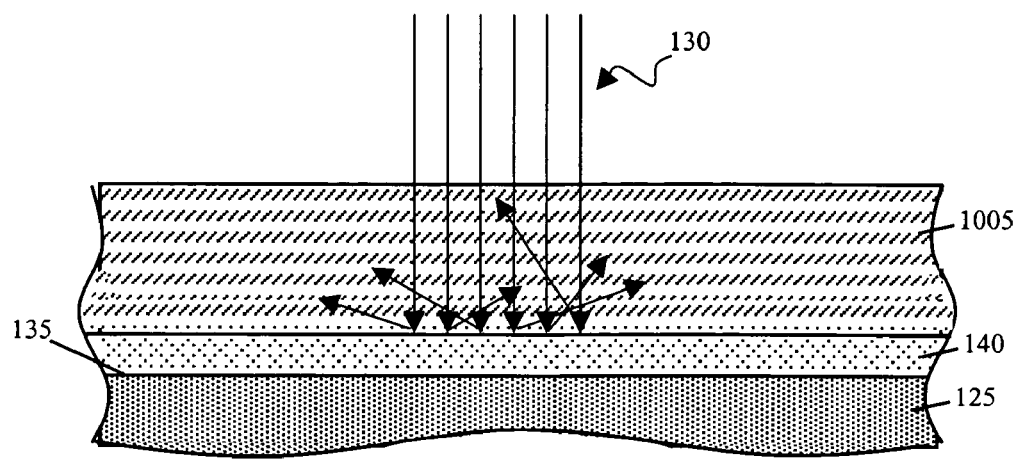
Figure 12:
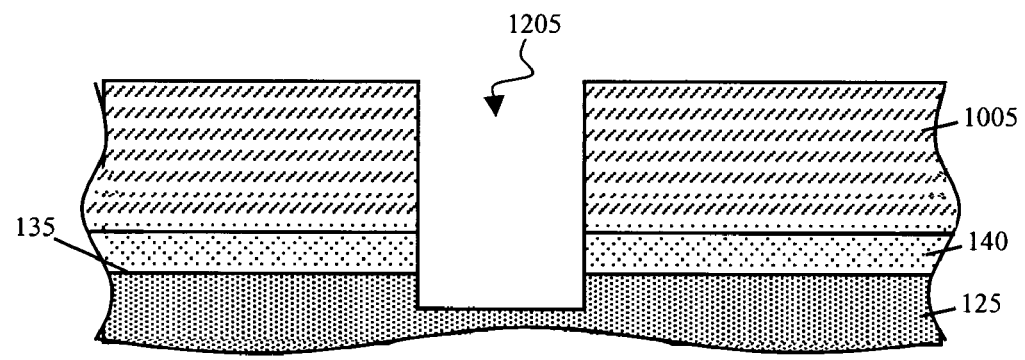

FIGS. 10-12 illustrate the use of optical coating 140 as a bottom antireflective coating on a planar portion of working surface 135 of substrate 125. As shown in FIG. 10, substrate 125 can be covered with photosensitive material 1005. Photosensitive materials are materials that change material properties in response to exposure to electromagnetic radiation. For example, photosensitive material 1005 can be positive or negative photoresist spun. Photosensitive material 1005 can be spun coat, dip coated, vapor deposited, or otherwise applied to working surface 135. As shown in FIG. 11, during exposure of photosensitive material 1005 to electromagnetic radiation 130, at least a portion of radiation 130 is scattered.

Such scattering can prevent standing waves from being established, reduce reflective notching, and hinder photoinduced chemical interactions between photosensitive material 1005 and working surface 135.

FIG. 12 shows that once photosensitive material 1005 is developed, optical coating 140 can be etched along with substrate 125 to form an etched feature 1205. Feature 1205 can extend through coating 140 and into substrate 125. Etched feature 1205 can be formed using a wet or a dry etch. In one implementation, the etch is an isotropic, plasma-assisted etch.

After resist 1005 is removed, in some implementations, optical coating 140 can be compatible with subsequent processing and need not be removed from substrate 125 for such processing to be performed. For example, optical coating 140 can be compatible with various "back end" processes, including machining (including milling, drilling, and dicing), metallization (including evaporation, sputtering, and electroplating), bonding (including adhesive application and welding), and surface modification (including wet and dry modification techniques).

In other implementations, optical coating 140 can be removed from substrate 125 prior to additional processing. For example, mesoporous poly-silicon can be removed by dry etching (e.g., an isotropic, plasma-assisted etch). The removal can be facilitated by the inclusion of an underlayer 905 on working surface 135, as discussed above.

A number of implementations have been described. Nevertheless, it will be understood that various modifications may be made, For example, substrate 125 can be a unitary whole rather than formed from multiple layers. Sidewalls 220 can span multiple layers rather than individual layers. Mesoporous polysilicon optical coatings 140 can be prepared by other techniques, including furnace crystallization of radio frequency (RF) sputtered silicon films followed chemical etching. Accordingly, other implementations are within the scope of the following claims.

What is claimed is:

1. A method comprising:
   isotropically forming a heterogeneous anti-reflective coating comprising polysilicon on a working surface of a substrate so that the rate of formation normal to any portion of the working surface of the substrate is substantially independent of the orientation of the portion, wherein the working surface of the substrate includes sidewalls and plateaus; and
   lithographically patterning a photosensitive material above the heterogeneous anti-reflective coating, including exposing the photosensitive material and the heterogeneous anti-reflective coating to an electromagnetic radiation.

2. The method of claim 1, wherein isotropically forming the coating comprises chemical vapor depositing the heterogeneous anti-reflective coating.

3. The method of claim 1, wherein isotropically forming the coating further comprises etching a chemical vapor deposited coating to introduce pores into the heterogeneous anti-reflective coating.

4. The method of claim 1, wherein isotropically forming the coating comprises forming a polysilicon layer on the working surface.

5. The method of claim 1, wherein isotropically forming the coating comprises causing the anti-reflective coating to outgas an organic ligand.

6. The method of claim 1, wherein isotropically forming the coating comprises forming a porous anti-reflective coating on the working surface of the substrate.

7. The method of claim 1, wherein the anti-reflective coating comprises a mesoporous polysilicon layer.

8. A device comprising:
   a heterogeneous anti-reflective coating comprising a polysilicon layer having a substantially equal thickness normal to any portion of the surface of a substrate independent of an orientation of the portion, wherein the working surface of the substrate includes sidewalls and plateaus, wherein
   the anti-reflective coating comprises a molecule to change an interaction between the anti-reflective coating and an electromagnetic radiation.

9. The device of claim 8, wherein the anti-reflective coating comprises a chemical vapor deposited anti-reflective coating.

10. The device of claim 8, wherein the anti-reflective coating comprises a porous anti-reflective coating defining at least one of pores, vessels, and holes.

11. The device of claim 10, wherein the at least one of the pores, the vessels, and the holes are filled with gas.

12. The device of claim 10, wherein the at least one of the pores, the vessels, and the holes are effective to scatter an ultraviolet electromagnetic radiation.

13. The device of claim 8, wherein the anti-reflective coating comprises photoresist residue from use of the anti-reflective coating as a bottom anti-reflective coating.

14. The device of claim 8, wherein the molecule comprises a dopant to increase reflectivity of the anti-reflective coating.

15. The device of claim 8, wherein the molecule comprises a dye to absorb the electromagnetic radiation.

16. The device of claim 8, wherein the anti-reflective coating comprises a mesoporous polysilicon layer.

17. A device comprising:
   a bottom anti-reflective coating comprising polysilicon and including at least one of pores, vessels, and holes effective to scatter an electromagnetic radiation; and
   an underlayer of silica beneath the bottom anti-reflective coating.

18. The device of claim 17, wherein the bottom anti-reflective coating comprises a porous layer defining at least one of mesoporous pores, vessels, and holes.

19. The device of claim 17, wherein the polysilicon comprises mesoporous polysilicon.

* * * * *